United States Patent
Philipp

(10) Patent No.: US 8,536,880 B2
(45) Date of Patent: Sep. 17, 2013

(54) CAPACITIVE SENSOR WITH ADDITIONAL NOISE-REGISTERING ELECTRODE

(75) Inventor: Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 492 days.

(21) Appl. No.: 12/675,732

(22) PCT Filed: Aug. 20, 2008

(86) PCT No.: PCT/GB2008/002816
§ 371 (c)(1),
(2), (4) Date: Apr. 8, 2010

(87) PCT Pub. No.: WO2009/027629
PCT Pub. Date: Mar. 5, 2009

(65) Prior Publication Data
US 2010/0301879 A1    Dec. 2, 2010

Related U.S. Application Data

(60) Provisional application No. 60/968,069, filed on Aug. 26, 2007.

(51) Int. Cl.
*G01R 27/26* (2006.01)
*G06F 3/041* (2006.01)

(52) U.S. Cl.
USPC ............ 324/658; 324/679; 324/686; 345/173

(58) Field of Classification Search
None
See application file for complete search history.

(56) References Cited

U.S. PATENT DOCUMENTS

| | | | |
|---|---|---|---|
| 3,826,979 A * | 7/1974 | Steinmann | 361/178 |
| 7,218,124 B1 * | 5/2007 | Mackey et al. | 324/660 |
| 7,262,609 B2 * | 8/2007 | Reynolds | 324/678 |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |

(Continued)

FOREIGN PATENT DOCUMENTS

| | | |
|---|---|---|
| DE | 8709630 | 11/1988 |
| EP | 0727875 A | 8/1996 |

(Continued)

OTHER PUBLICATIONS

"Application Serial No. PCT/GB2008/002816, International Search Report mailed Nov. 28, 2008", 3 pages.

(Continued)

*Primary Examiner* — Vinh Nguyen
(74) *Attorney, Agent, or Firm* — Baker Botts LLP

(57) ABSTRACT

A capacitive touch sensor employing adjacent drive and sense electrodes, in which an additional sense electrode is provided as well as a conventional drive electrode and sense electrode. The drive and two sense electrodes are arranged on the bottom side of a dielectric panel, the top side providing a sensing surface to be touched by a user's finger or a stylus. The additional sense electrode is positioned on the underside of the dielectric panel so that it is shielded from the drive electrode by the conventional sense electrode. The signal collected from the additional sense electrode is subtracted from the signal collected from the conventional sense electrode to cancel noise.

14 Claims, 4 Drawing Sheets

(56) References Cited

U.S. PATENT DOCUMENTS

| | | |
|---|---|---|
| 8,049,732 B2 | 11/2011 | Hotelling |
| 8,179,381 B2 | 5/2012 | Frey |
| 2005/0122119 A1 | 6/2005 | Barlow |
| 2005/0139885 A1* | 6/2005 | Liu .................. 257/296 |
| 2006/0007171 A1* | 1/2006 | Burdi et al. ............ 345/173 |
| 2006/0176063 A1* | 8/2006 | Ahn et al. ............. 324/688 |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

FOREIGN PATENT DOCUMENTS

| | | |
|---|---|---|
| EP | 1562293 A | 8/2005 |
| FR | 2195875 A | 3/1974 |
| WO | WO-2006015724 A | 2/2006 |
| WO | WO 2012/129247 | 9/2012 |

OTHER PUBLICATIONS

"Application Serial No. PCT/GB2008/002816, Written Opinion", 8 pages.

* cited by examiner

CAPACITIVE SENSOR WITH ADDITIONAL NOISE-REGISTERING ELECTRODE

RELATED APPLICATION

This application is a U.S. National Stage Filing under 35 U.S.C. 371 from International Patent Application Serial No. PCT/GB2008/002816, filed Aug. 20, 2008, and published on Mar. 5, 2009 as WO 2009/027629 A1, which claims the benefit of U.S. Provisional Application Ser. No. 60/968,069, filed on Aug. 26, 2007, the content of which are incorporated herein by reference in their entirety.

BACKGROUND OF THE INVENTION

The invention relates to capacitive sensors, in particular design approaches which reduce noise, in particular common mode noise.

Capacitive proximity sensors are based on detecting a disturbance in a capacitive coupling of sensor electrodes, either to ground or to another electrode, caused by the proximity of a pointing object, such as a human finger or a stylus.

Example devices include single control buttons, i.e. non-position sensitive detectors or so-called zero dimensional sensors, as well as position sensitive detectors which can be classified into one-dimensional and two-dimensional sensors.

One-dimensional capacitive sensors are found in linear or circular form as lighting controls, television remote controls, and in solid state MP3 portable music players, for example.

Two-dimensional capacitive sensors are found in touch screens, touch sensitive keyboards and key pads, for example, and are commonly used in consumer electronic devices and domestic appliances. Such sensors are often used in conjunction with an underlying display, such as a liquid crystal display (LCD), or cathode ray tube (CRT).

Other devices which may incorporate position sensitive capacitive sensors include pen-input tablets and encoders used in machinery for feedback control purposes, for example. Position sensitive capacitive touch sensors are capable of reporting at least a 2-dimensional coordinate, Cartesian or otherwise, related to the location of an object or human body part, by means of a capacitance sensing mechanism.

Devices employing position sensitive capacitive touch sensors have become increasingly popular and common, not only in conjunction with personal computers, but also in all manner of other appliances such as land line and mobile telephones, personal digital assistants (PDAs), point of sale (POS) terminals, electronic information and ticketing kiosks, kitchen appliances and the like.

Capacitive touch-sensors can be classified into two types in terms of the manner in which the signal is sensed, namely single-ended electrodes and adjacent transverse electrodes.

U.S. Pat. No. 5,730,165 and U.S. Pat. No. 6,466,036 describe a capacitive sensing device of the single-ended electrode type which relies on measuring the capacitance of a sensing electrode to a system reference potential, most commonly earth or ground. The pointing device, typically a human finger or a stylus, thus effectively defines ground and may be thought of as the second "plate" in the capacitor, with the sensing electrode forming the first "plate". The user's actions may then be considered as varying the separation between the plates of a capacitor, and hence vary the measured capacitance.

U.S. Pat. No. 6,452,514 describes a capacitive sensing device of the transverse electrode type which is based on measuring capacitive coupling between two adjacent electrodes. In such a sensor, one electrode, the so-called drive electrode, is supplied with an oscillating drive signal, and this signal is capacitively coupled to another electrode, the so-called sense electrode. The degree of capacitive coupling of the drive signal to the sense electrode is determined by measuring the amount of charge transferred to the sense electrode by the oscillating drive signal. The amount of charge transferred, i.e. the strength of the signal seen at the sense electrode, is a measure of the capacitive coupling between the electrodes, which is influenced by the proximity of the pointing object. The pointing object therefore may be considered to change the dielectric environment, and thus the field, between the two "plates" of the capacitor formed by the drive and sense electrodes, and hence change the measured capacitance.

It is known in the art that capacitive touch (or proximity) sensor of the transverse electrode type are prone to noise problems, in particular common mode noise injected into the raw signal collected during sensing, and the invention aims to solve or mitigate this problem.

SUMMARY OF THE INVENTION

According to the invention there is provided a capacitive touch sensor comprising a dielectric panel overlying a drive electrode, a first sense electrode and a second sense electrode, the electrodes being separated by coupling gaps, wherein the second sense electrode is positioned to be shielded from the drive electrode by the first sense electrode, so that in use the first sense electrode receives the majority of charge coupled from the drive electrode and the second sense electrode primarily registers noise.

In this way, the choice of electrode arrangement, in particular the provision of the second sense electrode which is not normally provided in a conventional capacitive sensor of the transverse electrode type can be used to reduce noise. This approach contrasts to approaches in which a conventional electrode arrangement is used, and approaches to reduce noise which are based solely on the signal processing, either by special design of the analogue circuitry used to collect, accumulate and/or process the low level signals, or by higher level digital processing. The proposed approach of the invention is not intended to be used to the exclusion of these other techniques, but rather it is preferred that it is used in combination with such other techniques to optimize performance. Indeed, it is an advantage of the present invention that the approach based on providing an electrode arrangement with a second sense electrode is compatible with such other techniques for reducing noise.

Moreover, as will be understood with reference to the detailed description, the approach of the invention is applicable to one- and two-dimensional capacitive touch sensors, and scalable to provide one- and two-dimensional capacitive touch sensors of different sizes and resolutions as desired.

The sensor preferably further comprises a sensing circuit including first and second detector channels connected to the first and second sense electrodes to receive first and second signal samples respectively, and operable to output a final signal obtained by subtracting the second signal sample from the first signal sample, thereby to cancel noise. The second sample is subtracted from the first sample on a sample-by-sample basis, or after summing a plurality of samples on each detector channel separately and performing the subtraction on the summed samples from each detector channel.

The electrodes may advantageously comprise multiple electrode elements, wherein the elements can be connected by suitable conductive wires, lines or traces. The electrode elements of the different electrodes, namely the drive electrode D, and the first and second sense electrodes S0 and S1, can then be interleaved in one or more repeats of the following sequence: . . . D, S0, S1, S0, D, S0, S1 . . . where the sequence preferably starts with either an element of the drive electrode or the second sense electrode, and preferably terminates with an electrode element of the same type. Namely, the first sense electrode and at least one of the drive electrode and the second sense electrode each comprise at least two electrode elements, and the electrode elements are arranged interleaved on the dielectric panel in at least one repeat of the sequence: drive electrode element, first sense electrode element, second sense electrode element, first sense electrode element, drive electrode element. Or alternatively, the first sense electrode and at least one of the drive electrode and the second sense electrode each comprise at least two electrode elements, and the electrode elements are arranged interleaved on the dielectric panel in at least one repeat of the sequence: second sense electrode element, first sense electrode element, drive electrode element, first sense electrode element, second sense electrode element. These two sequences both provide a symmetrical arrangement whereby the electrode elements can terminate at both extremities of their repeat pattern either with two drive electrodes or two signal sense electrodes.

The invention also provides a method of capacitive touch sensing comprising: providing a capacitive touch sensor comprising a dielectric panel overlying a drive electrode, a first sense electrode and a second sense electrode, the electrodes being separated by coupling gaps, wherein the second sense electrode is positioned to be shielded from the drive electrode by the first sense electrode; actuating the drive electrode to couple the majority of charge from the drive electrode to the first sense electrode; sampling the first sense electrode to collect a first signal sample; sampling the second sense electrode to collect a second signal sample; subtracting the second signal sample from the first signal sample to obtain a final signal; and outputting the final signal.

In the method, the said sampling steps are preferably carried out simultaneously. The invention may also be implemented with the sampling steps carried out at different times, in particular if the temporal characteristics of the noise are predictable.

The inventive concept is also transferable to capacitive sensors of the single-ended type to provide further aspects to the invention. Namely, according to a further aspect of the invention there is provided a capacitive touch sensor comprising a dielectric panel overlying a measurement electrode and a noise electrode separated by a gap, wherein the measurement electrode is located at an input area and the noise electrode is positioned adjacent thereto, so that in use the measurement electrode receives the majority of charge coupled from a pointing object and the noise electrode primarily registers noise. There may be multiple measurement electrodes, and a noise electrode may be distributed over an area common to a plurality of the measurement electrodes.

The invention also provides a corresponding method of capacitive touch sensing comprising: providing a capacitive touch sensor comprising a dielectric panel overlying a measurement electrode and a noise electrode separated by a coupling gap, wherein the measurement electrode is located at an input area and the noise electrode is positioned adjacent thereto; sampling the measurement electrode to collect a first signal sample; sampling the noise electrode to collect a second signal sample; subtracting the second signal sample from the first signal sample to obtain a final signal; and outputting the final signal.

In the method, the said sampling steps are preferably carried out simultaneously. The invention may also be implemented with the sampling steps carried out at different times, in particular if the temporal characteristics of the noise are predictable.

It will be appreciated that the invention can be applied to all the types of capacitive sensor mentioned in the introduction. Specifically, the invention may be applied to discrete control-buttons, one-dimensional capacitive sensors and two-dimensional sensors with or without displays. Moreover, sensors according to the invention may be incorporated in a wide variety of devices including those mentioned in the introduction.

BRIEF DESCRIPTION OF THE DRAWINGS

For a better understanding of the invention and to show how the same may be carried into effect reference is now made by way of example to the accompanying drawings.

DETAILED DESCRIPTION

Figure 1:
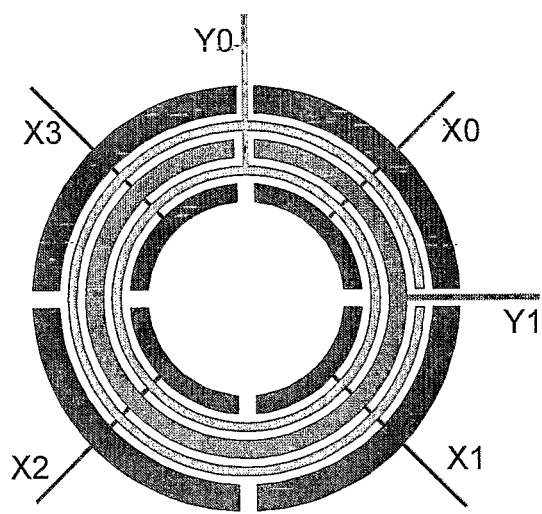
FIG. 1 shows schematically an electrode configuration of a first embodiment of the invention.

FIG. 1 shows schematically an electrode configuration of a first embodiment of the invention in the form of a basic wheel of the type familiar for example from solid state or hard drive MP3 portable music players. This is in effect a linear sensor, known in the art as a slider, wrapped around into a closed circle. It is noted that the same electrode configuration could be adapted by notionally cutting it into a C-shape and opening into an arc or line to make a linear or arcuate slider.

The electrode configuration comprises drive electrodes X0, X1, X2, X3 provided for respective quadrants of the circle as well as two sense electrodes Y0 and Y1. The Y0 electrode serves as the conventional sense electrode of a capacitive touch (or proximity) sensor of the adjacent transverse electrode type, and the Y1 electrode is an additional sense electrode provided for noise reference according to the invention. In this document, the Y0 electrode is referred to as the signal sense electrode, and the Y1 electrode as the noise sense electrode.

The principles of a capacitive touch (or proximity) sensor of this type are described in U.S. Pat. No. 6,452,514 which is incorporated herein by reference. In the case of the present invention, the mode of use is to interpolate signals between adjacent electrode sets so as to provide a more continuous position sensing effect.

It is noted that the respective surface areas of the Y0 and Y1 electrodes are made equal, even though this is not accurately depicted by the schematic drawing which is slightly out of perspective in this respect with the Y1 surface area being illustrated as slightly larger than the sum of the surface areas of the Y0 electrodes. Since the Y0 electrode includes two ring elements, and the Y1 electrode only one ring element, this means that the radial width of the arcuate Y1 electrode elements is twice that of the Y0 electrode elements. This is done to ensure that the Y0 and Y1 electrodes are equivalent for noise.

The sensing element design described herein and shown in the figures suppresses common mode noise by having two receive or sense electrodes Y0 and Y1, which are both adjacent a finger (or other object) touching or in proximity with an overlying panel surface. Common mode noise is coupled into the Y electrodes approximately in equal measure, since the finger will be larger than the width of the electrode set (radially as shown). Signal coupling comes from absorption of coupling from the Xn lines to the Y0 trace arcs (as shown) on edges of the Xn signal's as is usual for a sensor of the transverse electrode type described in U.S. Pat. No. 6,452,514. The Y1 arc electrode does not receive appreciable signal from lines Xn (X0, X1, X2, X3 electrodes) as it is shielded from the Xn arcs by intervening Y0 arcs.

The reader will understand that the various sets of electrodes do not make direct electrical contact with each other and that appropriate cross-over arrangements that are known in the art are used to provide this isolation. The drive electrodes Xn are shown as sectors or pie-wedges that subtend slightly less than ninety degrees of arc, and the receive electrodes Yn form nearly complete circles.

FIG. 1 shows that the signals are coupled into the two Y0 arcs from both an inner and an outer Xn electrode set across the coupling gaps as is known in the art. The field lines emit from arcs Xn and project into an overlying dielectric panel, and arc downwards into the Y lines which act as virtual grounds. The Y0 electrode elements receive the majority of this charge coupling.

The sensing circuit comprises two sampling detector channels D0, D1 connected to electrodes Y0, Y1 respectively, which are sampled repetitively but in as precise a time-coincidence as is possible, which is made possible by running these sample channels on the same port of a microcontroller unit (MCU).

Signal processing comprises the subtraction of the signal samples S0 and S1 (corresponding to detector channels D0, D1) as $S_{FINAL}=S0-S1$. The subtraction can be made either on a sample-by-sample basis or after summing a number of samples of S0 and separately a number of samples of S1 first, e.g., $$S_{FINAL}=\Sigma S0-\Sigma S1$$

or $$S_{FINAL}=\Sigma(S0-S1)$$

Since signal sample S1 is coupled from electrode Y1 which primarily registers noise and very little signal change due to object proximity, and due to dimensional confinement of the electrode set with respect to the detected object (e.g. a finger), the noise apparent on signal sample S0 is cancelled by this subtraction process. It is noted that the surface area of the electrode Y1 should be close to the same electrode area as electrode Y0, so that the noise coupling is balanced and the process of subtraction is efficient at noise reduction.

The additional circuit cost in each case is an extra Y receive line.

The conductive elements may be formed from indium tin oxide (ITO) sensors or copper-based.

Finger location is performed via interpolation among the quadrants as is known in the art.

The number of X or drive electrodes can be increased proportionate to the overall diameter for best interpolative effect.

Figure 2:
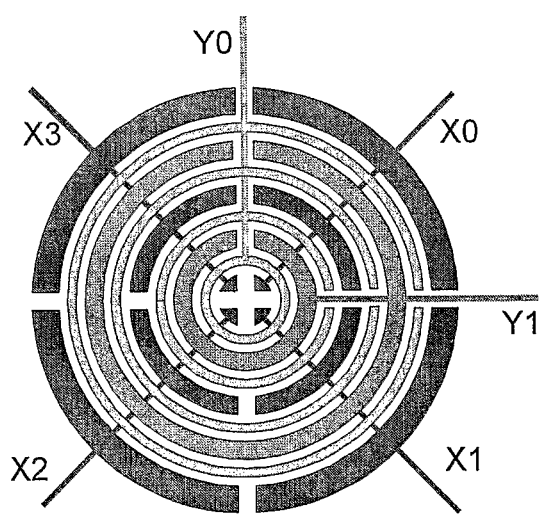
FIG. 2 shows schematically an electrode configuration of a second embodiment of the invention.

FIG. 2 shows schematically an electrode configuration of a second embodiment of the invention. Compared with the first embodiment, the second embodiment may be characterized by saying that the circle is filled to allow a Cartesian response without a gap in the middle. Full Cartesian readout may be required for example on a track pad. The circle is filled with repeats of the same sequence, e.g., from inside to out:

$$Xn/Y0/Y1/Y0/Xn/Y0/Y1/Y0/Xn$$

where the first Xn is a filled circle of conductive element in the centre.

As in the first embodiment, for noise equivalence, the radial width of the arcuate Y1 electrode elements is twice that of the Y0 electrode elements. Similar comments regarding variants as made in relation to the first embodiment apply also.

Figure 3:
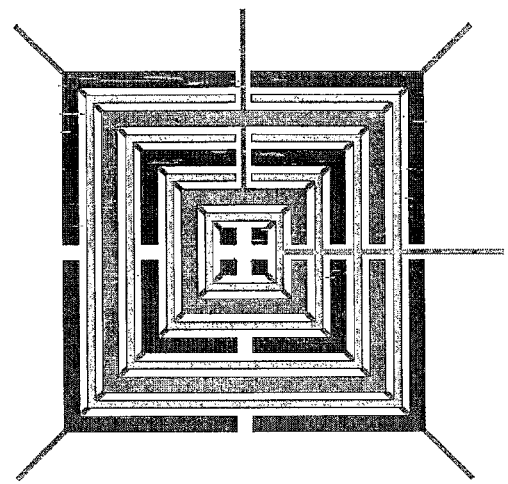
FIG. 3 shows schematically an electrode configuration of a third embodiment of the invention.

FIG. 3 shows schematically an electrode configuration of a third embodiment of the invention. This is topologically identical to the electrode configuration of the second embodiment, with the circular/arcuate electrode elements being changed to square shapes. Namely, each of the four drive electrode quadrants is formed of L-shaped electrode elements, and the four quadrants collectively form a square shape. The signal and noise sense electrodes are similarly formed of square-shaped elements instead of circular elements.

The conductive sensing pattern can thus be made square, or rectangular, in shape, which may be used for 'normal' track pads with Cartesian outputs. The number of X or drive electrodes can be increased proportionate to the overall length for best interpolative effect.

Figure 4:
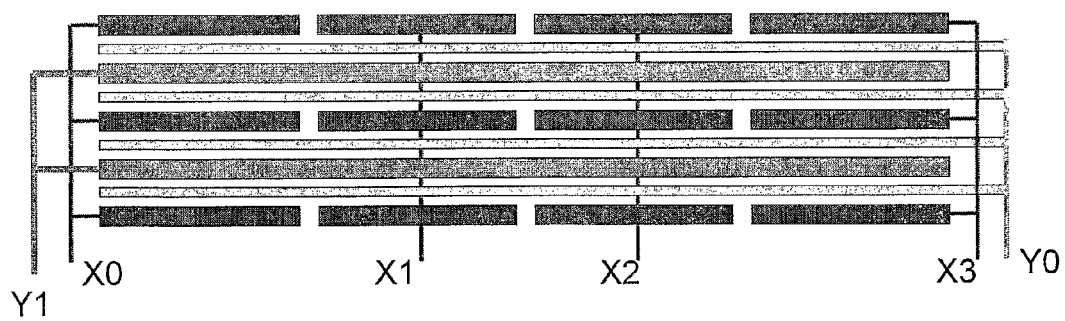
FIG. 4 shows schematically an electrode configuration of a fourth embodiment of the invention.

FIG. 4 shows a sensor element in the form of a repeating pattern to create a Cartesian sensing surface, i.e. two-dimensional touch sensor surface. This type of electrode pattern may also be used for a linear slider, i.e. one-dimensional touch sensor surface. The number of Xn drive lines can be increased as desired to extend the length and/or horizontal resolution.

For best interpolative effect, each segment of the drive sensor electrode Xn should have a length of 8 mm or less.

Additional filtering can and usually should be performed as the described electrode set may not be perfect at noise suppression. As such the invention can be seen as one of a number of methods which is useful in the suppression of noise, often in combination with other methods.

Figure 5:
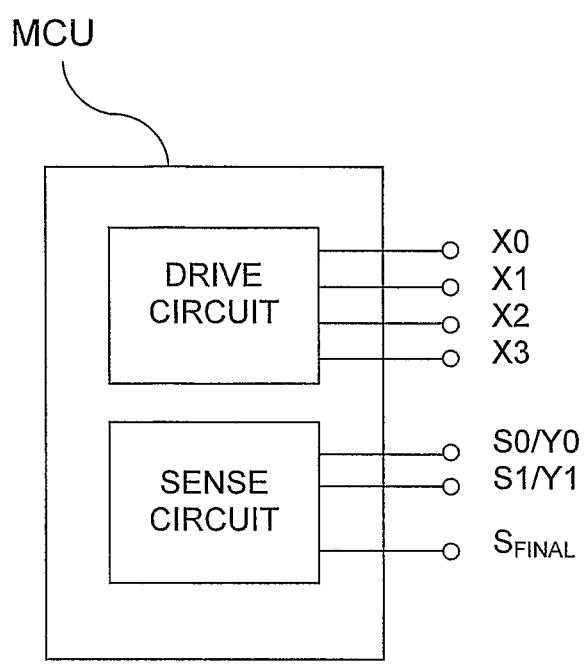
FIG. 5 is a schematic block diagram showing a microcontroller unit suitable for use in the above embodiments.

FIG. 5 is a schematic block diagram showing a microcontroller unit (MCU) suitable for use in the above embodiments which comprises a drive circuit and a sense circuit. The drive electrodes Xn are connected to respective outputs of a drive circuit. The sense circuit is connected to receive signals from the first and second sense electrodes Y0 and Y1 via the respective sense channels S0 and S1, and to output the final signal $S_{FINAL}$ to an output thereof. The detailed functioning of the drive and sense circuits will be understood with reference to the prior art, in particular U.S. Pat. No. 6,452,514 referred to above.

While the embodiments show sensors capable of resolving position in two-dimensions, the invention is equally applicable to one-dimensional position sensors as well as capacitive sensors with no position sensing capability, e.g. discrete buttons.

With reference to the embodiment of FIG. 1, it will be appreciated that a simpler electrode configuration according to the invention could be provided by omitting the inner two concentric rings of electrode elements, so that the drive (Xn) electrodes consist only of the single depicted radially outermost arcuate portion, the signal sense (Y0) electrode consists only of its radially outermost ring portion, and the noise sense (Y1) electrode is unchanged in its structure. In this reduced configuration, the Y1 electrode is still screened from the drive electrodes according to the teaching of the invention. The design can be simplified one stage further by providing only a single drive electrode, in which case the device reduces effectively to a sensor with no position resolving capability which would be suitable for use as a single button. Similar variations starting from the other illustrated embodiments can also be envisaged.

With reference to the embodiment of FIG. 1, it will also be appreciated that a more involved electrode configuration according to the invention could be provided by providing additional outer concentric rings of electrode elements following the same sequence.

Providing equal areas for the Y0 and Y1 electrodes for noise equivalence as described in the embodiments above is not the only design option. Another option is to scale the relative areas of the noise sense and signal sense electrodes in favor of the signal sense electrodes, i.e. so that more area is taken up by the signal sense electrodes than the noise sense electrodes, for example in an integer ratio such as 2:1, 3:1, 3:2 etc, or an arbitrary ratio. The ratio of Y0/Y1 electrode areas can be dealt with in signal processing by multiplying the magnitude of the signal from the noise sense electrodes by the inverse of the ratio of areas between the Y0/Y1 electrodes so that they provide equivalent contributions. This allows the noise sense electrodes to be made smaller and thus reduce the amount of touch sensor area occupied by the noise sense electrodes, as compared with the signal sense electrodes (and drive electrodes).

Another approach to the same issue, which may be used instead of or in combination with selection of a desired ratio of areas for the signal sense and noise sense electrodes, is to measure the relative contribution of the signal sense and noise sense electrodes at a calibration stage, either during manufacture or on device start-up, and to scale the magnitude of the signals received—from the noise sense electrode according to this calibration.

It will be appreciated that some sources of noise are highly localized, for example noise arising from display drive electronics, when the capacitive touch sensor overlies a display. In such cases, it is desirable for the noise sense electrodes to be directly adjacent their corresponding signal sense electrodes, as in the above embodiments. However, other noise sources may not be localized to the scale of the capacitive touch sensor, for example many forms of environmental noise, or noise emanating from a separate part of a system of which the capacitive touch sensor forms a part, for example the noise generated by internal combustion engine of an automotive vehicle and its effect on a capacitive touch screen in the passenger cabin of the vehicle. In such cases, the noise sense electrodes may be arranged separate from the signal sense electrodes, and may indeed not even be located on the area of the sensor available for touch, but rather around the rim of a touch sensor, for example under a protective frame surrounding the periphery of the sensor area.

In the above, it was said that the signal and noise detector channels D0 and D1 should ideally be sampled simultaneously. While this is desirable, especially if the noise is spontaneous and asynchronous in character, if the noise source is relatively invariant in magnitude over time, or has a predictable temporal evolution, then the signal and noise detector channels D0 and D1 may be sampled at different times.

To summarize the above-described embodiments, a capacitive touch sensor of the transverse electrode type is provided. The sensor has an additional sense electrode as well as the conventional drive electrode(s) and sense electrode. The drive and sense electrodes are arranged on the bottom side of a dielectric panel, the top side providing a sensing surface to be touched by a user's finger or a stylus. The additional sense electrode is positioned on the underside of the dielectric panel so that it is shielded from the drive electrode by the conventional sense electrode. As a consequence, the conventional sense electrode is much more sensitive to the proximity of the finger or stylus than the additional sense electrode which primarily registers noise. The signal collected from the additional sense electrode is then subtracted from the signal collected from the conventional sense electrode, thereby to cancel noise.

Figure 6:
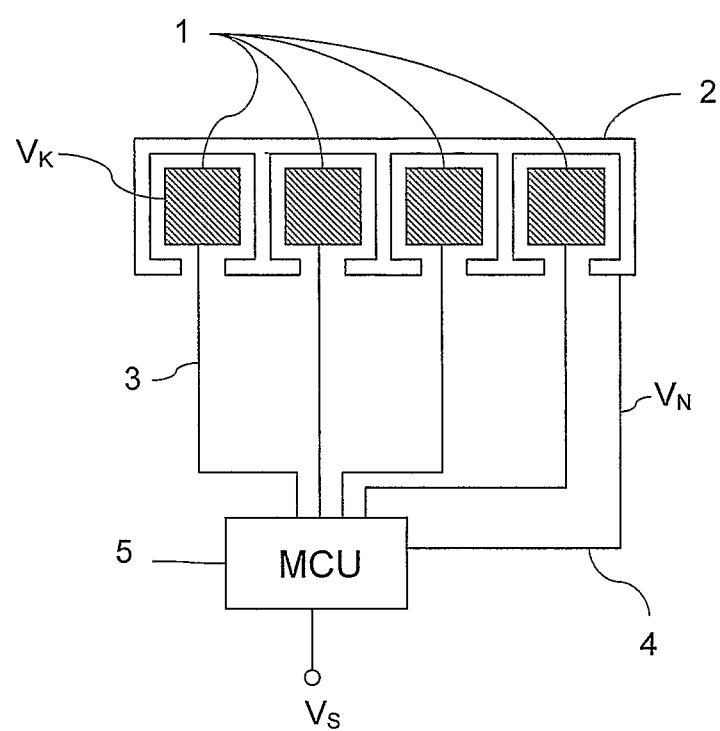
FIG. 6 shows schematically an electrode configuration and output connections of an alternative embodiment of the invention.

FIG. 6 shows schematically an electrode configuration and output connections of an alternative embodiment of the invention based on a single-ended electrode design of the type known from U.S. Pat. No. 5,730,165 and U.S. Pat. No. 6,466,036. A conventional array of buttons 1 is provided, wherein each button is formed by a measurement electrode arranged on the underside of a dielectric panel (not shown), such as a glass panel, as is well known in the art. Each measurement electrode 1 is connected by a suitable conductive connection 3 to a microcontroller unit (MCU) 5 or other suitable signal processing circuit and in use supplies a voltage signal $V_K$. It will be understood that each connection 3 will typically comprise a first portion deposited or otherwise formed on the underside of the panel and a second portion of external wiring to connect to the MCU 5. In the figure, a single row of four electrodes is illustrated, but it will be understood that a two-dimensional array could be provided, or a single button. It will also be understood that in many implementations a display, such as an LCD display, will lie on top of or below the sensor array.

According to this embodiment of the invention, there is additionally provided a noise electrode 2 which is distributed over an area common to the measurement electrodes 1, but electrically isolated therefrom by suitable gaps to avoid short circuiting. Specifically the noise electrode 2 is arranged to substantially surround each of the measurement electrodes 1. In other implementations, the noise electrode could be only to one side of the measurement electrode, or two sides, for example. The noise electrode 2 is connected to the MCU 5 by a connection 4 with similar electrical properties to connection 3 and in use supplies a voltage signal $V_N$ to the MCU 5. Similar to the previous embodiments, signal processing involves the subtraction of the noise signal samples from the measurement signal samples, i.e. the signal output from the MCU 5 is, in terms of voltages, $V_{FINAL} = V_K - V_N$. As in the previous embodiments, the subtraction can be made either on a sample-by-sample basis or after separately summing a number of samples from each electrode first.

The input area provided by the measurement electrodes are preferably identifiable by a user, typically visually. This can be achieved in a number of different ways. For example, the user may identify the measurement electrode area by a static marking on the panel, such as a visual label, or by surface structure or relief in the panel, such as an indentation or recess, or a promontory or protuberance, or the combination of both. Alternatively, a display may be used to indicate the measurement electrode areas. The identification of the input areas to be actuated by the user's finger or other pointing object ensures that the measurement electrodes function as such, and the noise electrode positioned adjacent thereto receive relatively little signal from the pointing object, so that in use the measurement electrode receives the majority of signal coupled from a pointing object and the noise electrode primarily registers noise. While this embodiment has been described solely in terms of a single noise electrode this is for simplicity only. It will be understood that multiple noise electrodes may be provided, either one for each measurement electrode, or one for each group of measurement electrodes, for example.

What is claimed is:

1. A capacitive touch sensor comprising:
a dielectric panel overlying a drive electrode, a first sense electrode and a second sense electrode, the electrodes being separated by coupling gaps, wherein the second sense electrode is positioned to be shielded from the drive electrode by the first sense electrode, so that in use the first sense electrode receives a majority of charge coupled from the drive electrode and the second sense electrode primarily registers noise; and
a sensing circuit including first and second detector channels connected to the first and second sense electrodes to receive first and second signal samples, respectively, and operable to output a final signal obtained by subtracting the second signal sample from the first signal sample.

2. The sensor of claim 1, wherein the second sample is subtracted from the first sample on a sample-by-sample basis.

3. The sensor of claim 1, wherein the second sample is subtracted from the first sample after summing a plurality of samples on each detector channel separately and performing the subtraction on the summed samples from each detector channel.

4. The sensor of claim 1, wherein the first sense electrode and at least one of the drive electrode and the second sense electrode each comprise at least two electrode elements, and the electrode elements are arranged interleaved on the dielectric panel in at least one repeat of the sequence: drive electrode element, first sense electrode element, second sense electrode element, first sense electrode element, drive electrode element.

5. The sensor of claim 1, wherein the first sense electrode and at least one of the drive electrode and the second sense electrode each comprise at least two electrode elements, and the electrode elements are arranged interleaved on the dielectric panel in at least one repeat of the sequence: second sense electrode element, first sense electrode element, drive electrode element, first sense electrode element, second sense electrode element.

6. A capacitive touch sensor comprising:
a dielectric panel overlying a plurality measurement electrodes and a continuous noise electrode distributed over an area common to the plurality of measurement electrodes and separated from the plurality of measurement electrodes by a gap, wherein the plurality of measurement electrodes are located at one or more input areas and the continuous noise electrode is positioned adjacent to the plurality of measurement electrodes, so that in use one or more of the plurality of measurement electrodes receive a majority of charge coupled from an object and the continuous noise electrode primarily registers noise; and
a sensing circuit operable to;
receive a first signal sample from at least one of the plurality of measurement electrodes;
receive a second signal sample from the continuous noise electrode; and
determine a final signal obtained by subtracting the second signal sample from the first signal sample.

7. The sensor of claim 6, wherein the second sample is subtracted from the first sample on a sample-by-sample basis.

8. The sensor of claim 6, wherein the second sample is subtracted from the first sample after summing a plurality of samples separately and performing the subtraction on the summed samples.

9. A capacitive touch sensor, comprising:
a dielectric panel overlying a drive electrode, a first sense electrode and a second sense electrode, the electrodes being separated by coupling gaps, wherein the second sense electrode is positioned to be shielded from the drive electrode by the first sense electrode, so that in use the first sense electrode receives a majority of charge coupled from the drive electrode and the second sense electrode primarily registers noise;
wherein the first sense electrode and at least one of the drive electrode and the second sense electrode each comprise at least two electrode elements, and the electrode elements are arranged interleaved on the dielectric panel in at least one repeat of the sequence: drive electrode element, first sense electrode element, second sense electrode element, first sense electrode element, drive electrode element.

10. The sensor of claim 9, further comprising:
a sensing circuit including first and second detector channels connected to the first and second sense electrodes to receive first and second signal, samples, respectively, and operable to output a final signal obtained by subtracting the second signal sample from the first signal sample;
wherein the second sample is subtracted from the first sample on a sample-by-sample basis.

11. The sensor of claim 9, further comprising:
a sensing circuit including first and second detector channels connected to the first and second sense electrodes to receive first and second signal samples, respectively, and operable to output a final signal obtained by subtracting the second signal sample from the first signal sample;
wherein the second sample is subtracted from the first sample after summing a plurality of samples on each detector channel separately and performing the subtraction on the summed samples from each detector channel.

12. A capacitive touch sensor, comprising:
a dielectric panel overlying a drive electrode, a first sense electrode and a second sense electrode, the electrodes being separated by coupling gaps, wherein the second sense electrode is positioned to be shielded from the drive electrode by the first sense electrode, so that in use the first sense electrode receives a majority of charge coupled from the drive electrode and the second sense electrode primarily registers noise;
wherein the first sense electrode and at least one of the drive electrode and the second sense electrode each comprise at least two electrode elements, and the electrode elements are arranged interleaved on the dielectric panel in at least one repeat of the sequence: second sense electrode element, first sense electrode element, drive electrode element, first sense electrode element, second sense electrode element.

13. The sensor of claim 12, further comprising:
a sensing circuit including first and second detector channels connected to the first and second sense electrodes to receive first and second signal samples, respectively, and operable to output a final signal obtained by subtracting the second signal sample from the first signal sample;
wherein the second sample is subtracted from the first sample on a sample-by-sample basis.

14. The sensor of claim 12, further comprising:
a sensing circuit including first and second detector channels connected to the first and second sense electrodes to receive first and second signal samples, respectively, and operable to output a final signal obtained by subtracting the second signal sample from the first signal sample;
wherein the second sample is subtracted from the first sample after summing a plurality of samples on each detector channel separately and performing the subtraction on the summed samples from each detector channel.

\* \* \* \* \*